(12) United States Patent
Wen et al.

(10) Patent No.: US 10,705,436 B2
(45) Date of Patent: Jul. 7, 2020

(54) OVERLAY MARK AND METHOD OF FABRICATING THE SAME

(71) Applicant: TAIWAN SEMICONDUCTOR MANUFACTURING CO., LTD., Hsinchu (TW)

(72) Inventors: Cheng-Yu Wen, Taichung (TW);
Yin-Jie Wang, Taichung (TW);
Hsiao-Chun Kuo, Taichung (TW);
Ming-Shane Lu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/144,836

(22) Filed: Sep. 27, 2018

(65) Prior Publication Data
US 2020/0103763 A1    Apr. 2, 2020

(51) Int. Cl.
*G03F 1/42* (2012.01)
*G03F 7/20* (2006.01)
*H01L 23/544* (2006.01)

(52) U.S. Cl.
CPC ............ *G03F 7/70633* (2013.01); *G03F 1/42* (2013.01); *H01L 23/544* (2013.01); *H01L 2223/54426* (2013.01)

(58) Field of Classification Search
CPC ..... G03F 7/70633; G03F 1/42; H01L 23/544; H01L 2223/54426
USPC ......................................................... 257/797
See application file for complete search history.

(56) References Cited

U.S. PATENT DOCUMENTS 5,017,514 A * 5/1991 Nishimoto .......... G03F 7/70591
356/400

\* cited by examiner

*Primary Examiner* — Tong-Ho Kim
(74) *Attorney, Agent, or Firm* — Maschoff Brennan

(57) ABSTRACT

An apparatus includes an overlay mark. The overlay mark includes a first portion including a first pattern and a second portion including a second pattern. The first pattern includes a plurality of first features and a first center feature each separated by a gap along a first direction. At least two gaps are the same but are different from the other gaps, and the first centers are symmetric with respect to the first center feature. The second pattern includes a plurality of second features and a second center feature each separated by a gap along the first direction. At least two gaps are the same but are different from the other gaps, and the second features are symmetric with respect to the second center feature. The first center feature of the first pattern is aligned with the second center feature of the second pattern along a second direction.

20 Claims, 16 Drawing Sheets

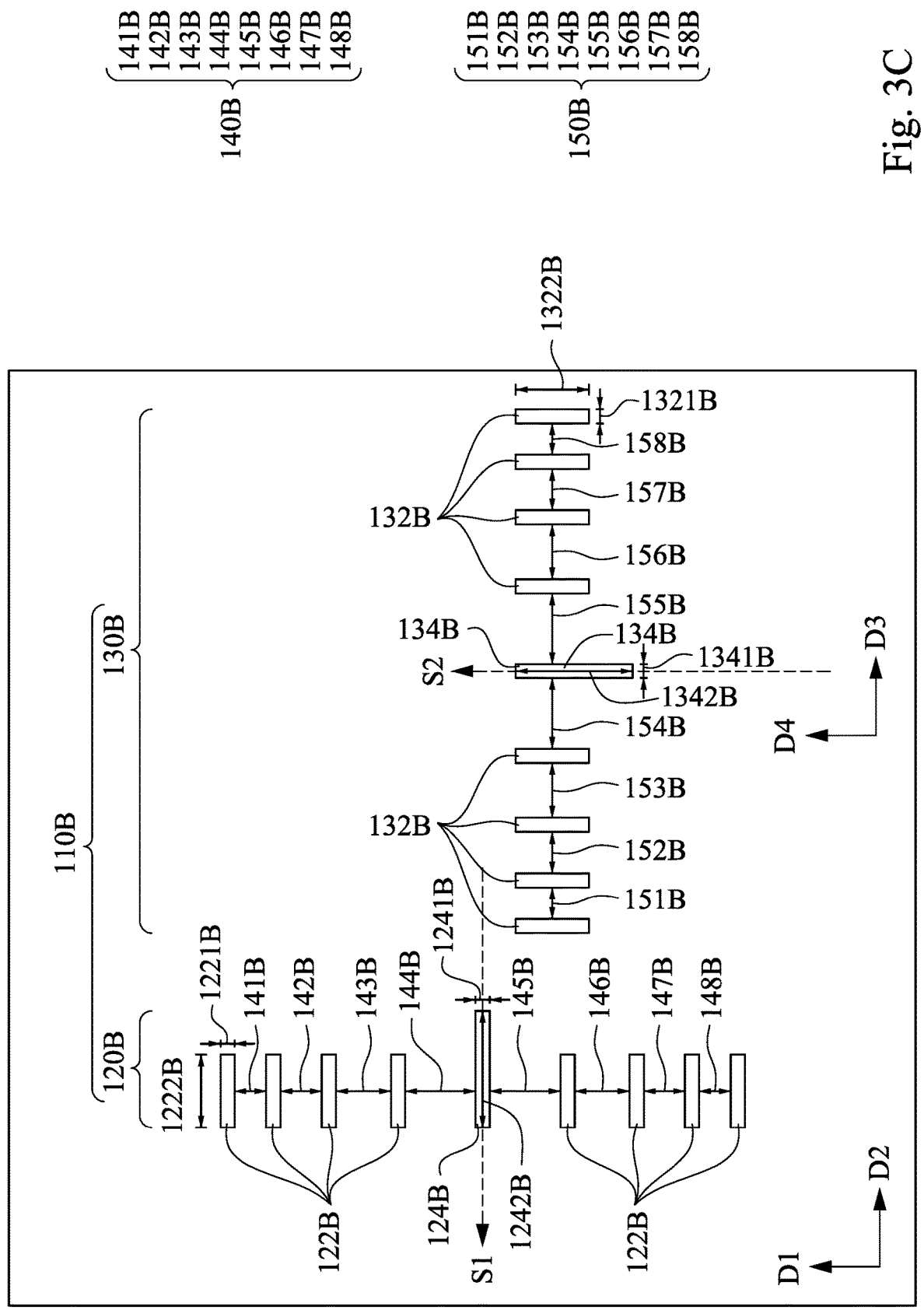

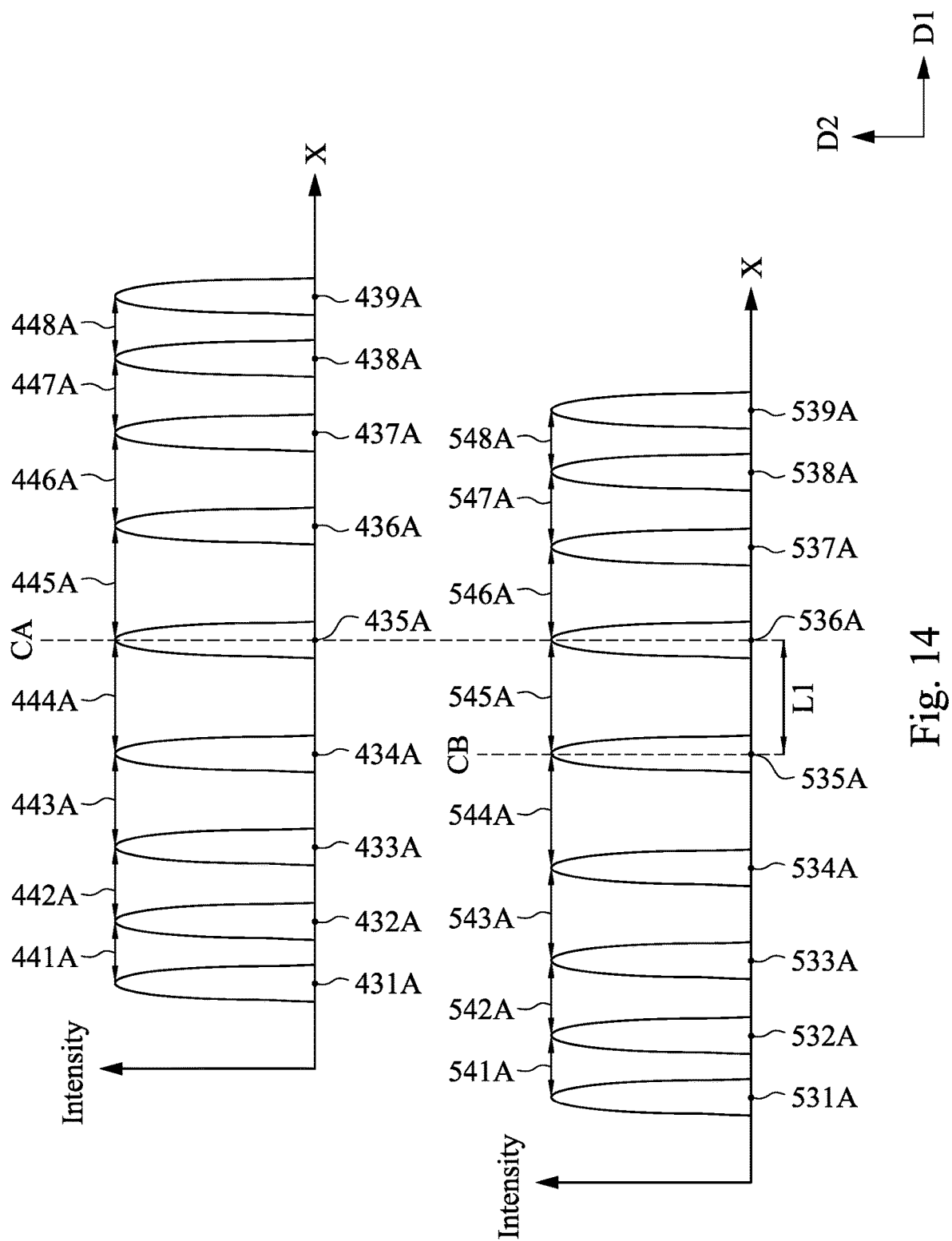

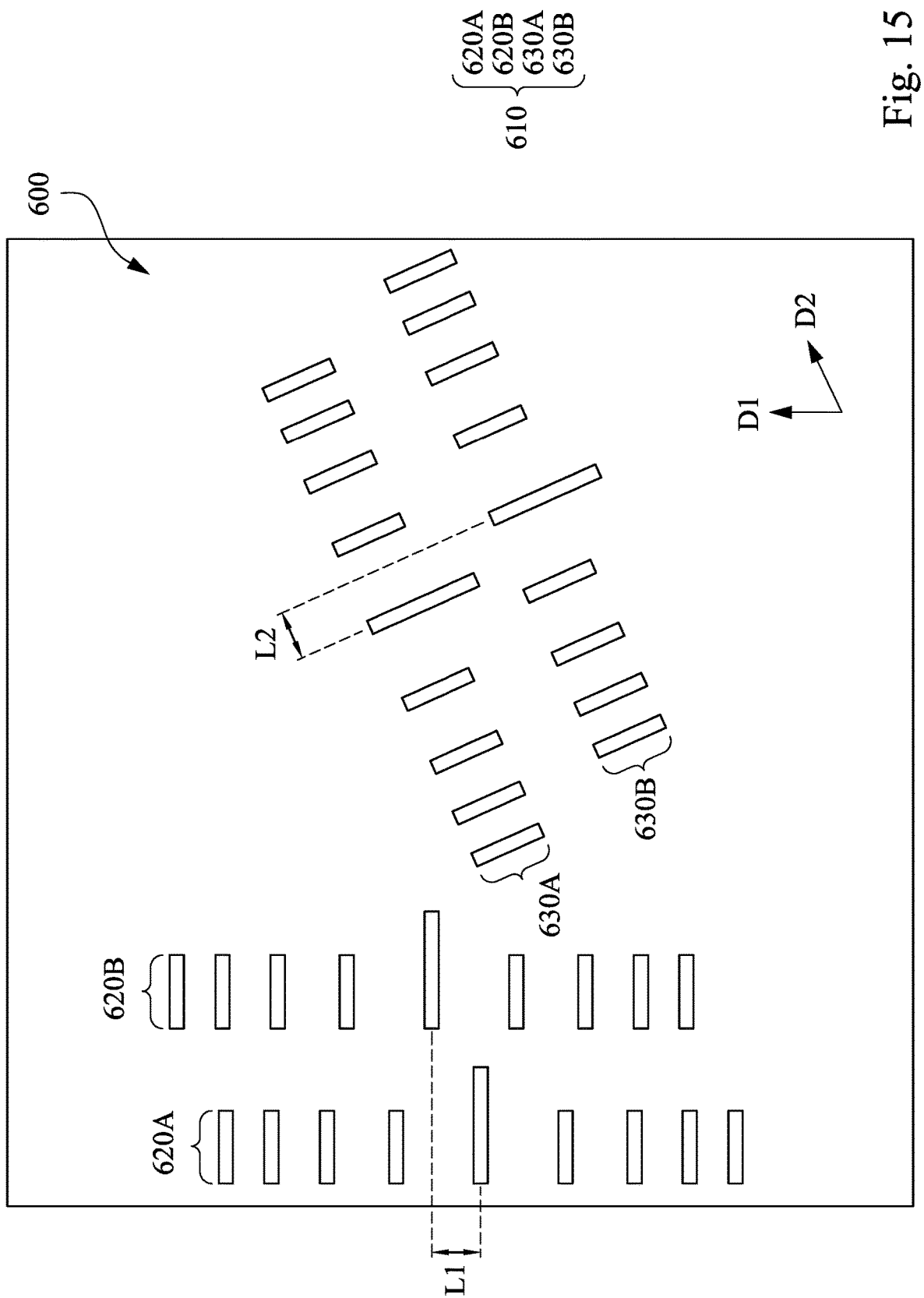

OVERLAY MARK AND METHOD OF FABRICATING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3C is a top view of an overlay pattern of the overlay mark in FIG. 3A according to some embodiments of the present disclosure.

FIG. 14 is an intensity plot of images of the regions of interest (ROIs) in FIG. 13

FIG. 15 is an overlay mark according to other embodiments of the present disclosure.

DETAILED DESCRIPTION

Figure 1:
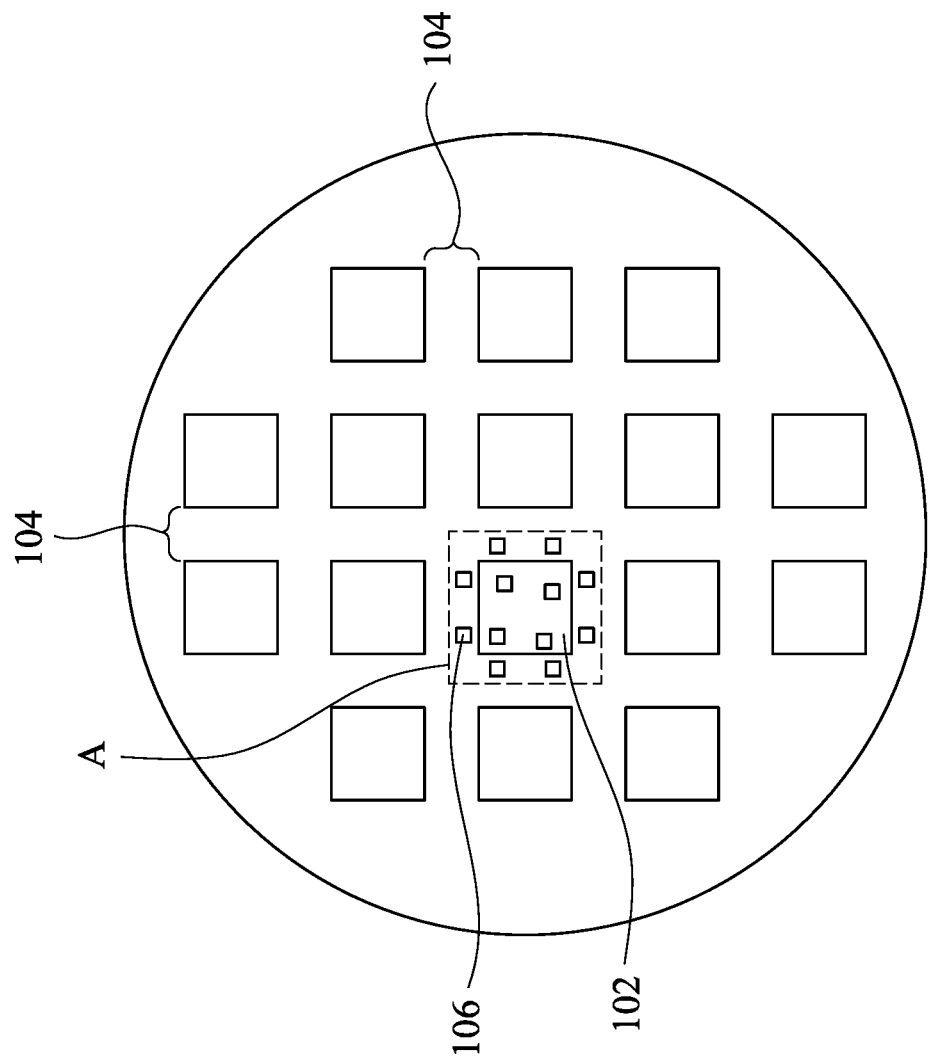
FIG. 1 is a top view of a wafer having die regions containing overlay regions according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a top view of a wafer 100 having die regions 102 containing overlay regions 106 according to some embodiments of the present disclosure. In some embodiments, the wafer 100 has one or more die regions 102 separated by scribe lines 104. The die regions 102 and the scribe lines 104 may both have one or more overlay regions 106.

Figure 2:
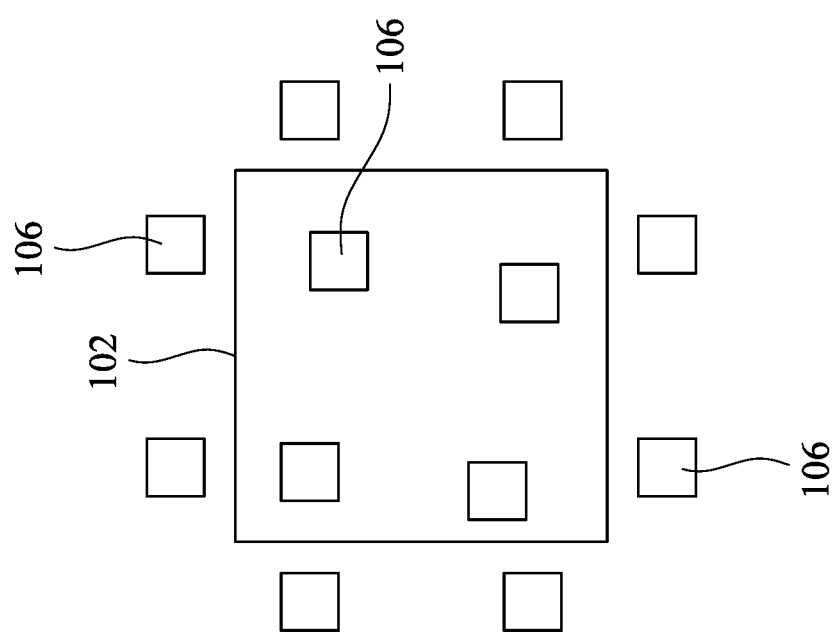
FIG. 2 is an enlarged view of the region A in FIG. 1 according to some embodiments of the present disclosure.

FIG. 2 is an enlarged view of the region A in FIG. 1 according to some embodiments of the present disclosure. Referring to FIG. 1 and FIG. 2, overlay regions 106 are disposed both in die region 102 and in the scribe lines 104 (see FIG. 1) around the die region 102. The overlay regions 106 may have one or more patterns permitting the alignment of various layers as the die region 102 is fabricated. In some embodiments, the overlay regions 106 are reserved for overlay marks or other fabrication related structures. The reserved regions may extend through more than one layer, with and overlay in the reserved region of each layer used to align layers relative to each other.

The die region 102 is formed by forming one or more active devices in a substrate, and then forming one or more layers of, for example, dielectric layers and metal layers, over the active device layer. To form the layers over the active layers, a layer design is used to form a mask. The mask is used, for example, in photolithography, where a photoresist is patterned using light shown through the mask. The photoresist may then be used to pattern a substrate, metal dielectric or the like for implant or etching. The overlay regions 106 are regions in each layer pattern that are reserved for overlay marks are used to align layer masks. A pattern is formed in a layer, and then a mask for a subsequent layer is aligned with the pattern in the previously formed layer. An overlay is a design in a layer pattern for forming an alignment mark or otherwise reserving the overlay region in a layer pattern. Different overlay patterns are associated with different layer types.

Figure 3A:
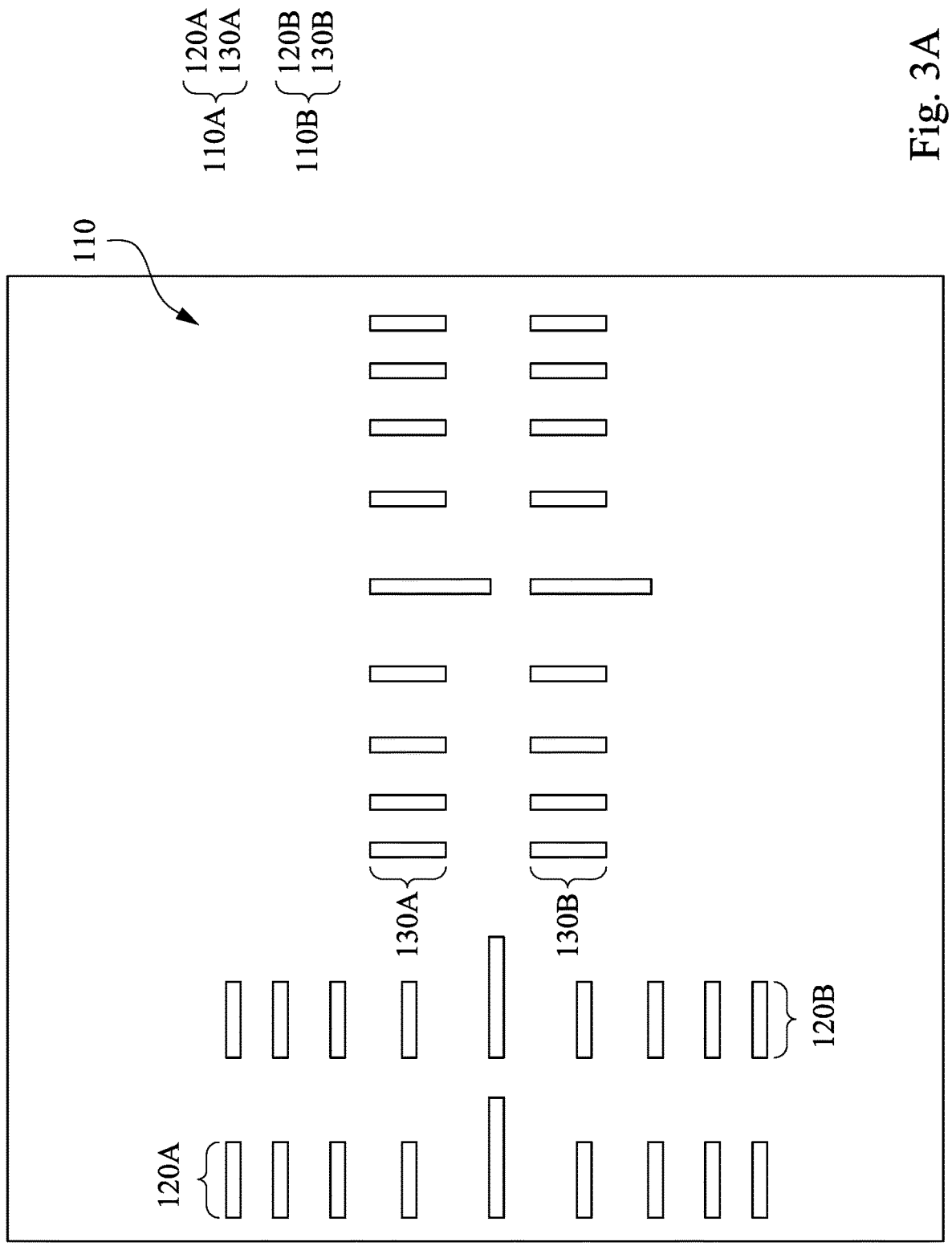
FIG. 3A is a top view of an overlay mark according to some embodiments of the present disclosure.

FIG. 3A is a top view of an overlay mark 110 according to some embodiments of the present disclosure. The overlay mark 110 includes a first overlay pattern 110A and a second overlay pattern 110B. The first overlay pattern 110A and the second overlay pattern 110B are the portions that will be formed in overlay regions of one layer of the wafer or separately formed in overlay regions of different layers of the wafer. For example, in some embodiments, the first overlay pattern 110A is formed in a layer, and then a photomask for a subsequent layer containing the second overlay pattern 110B is aligned with the first overlay pattern 110A in the previously formed layer.

Figure 3B:
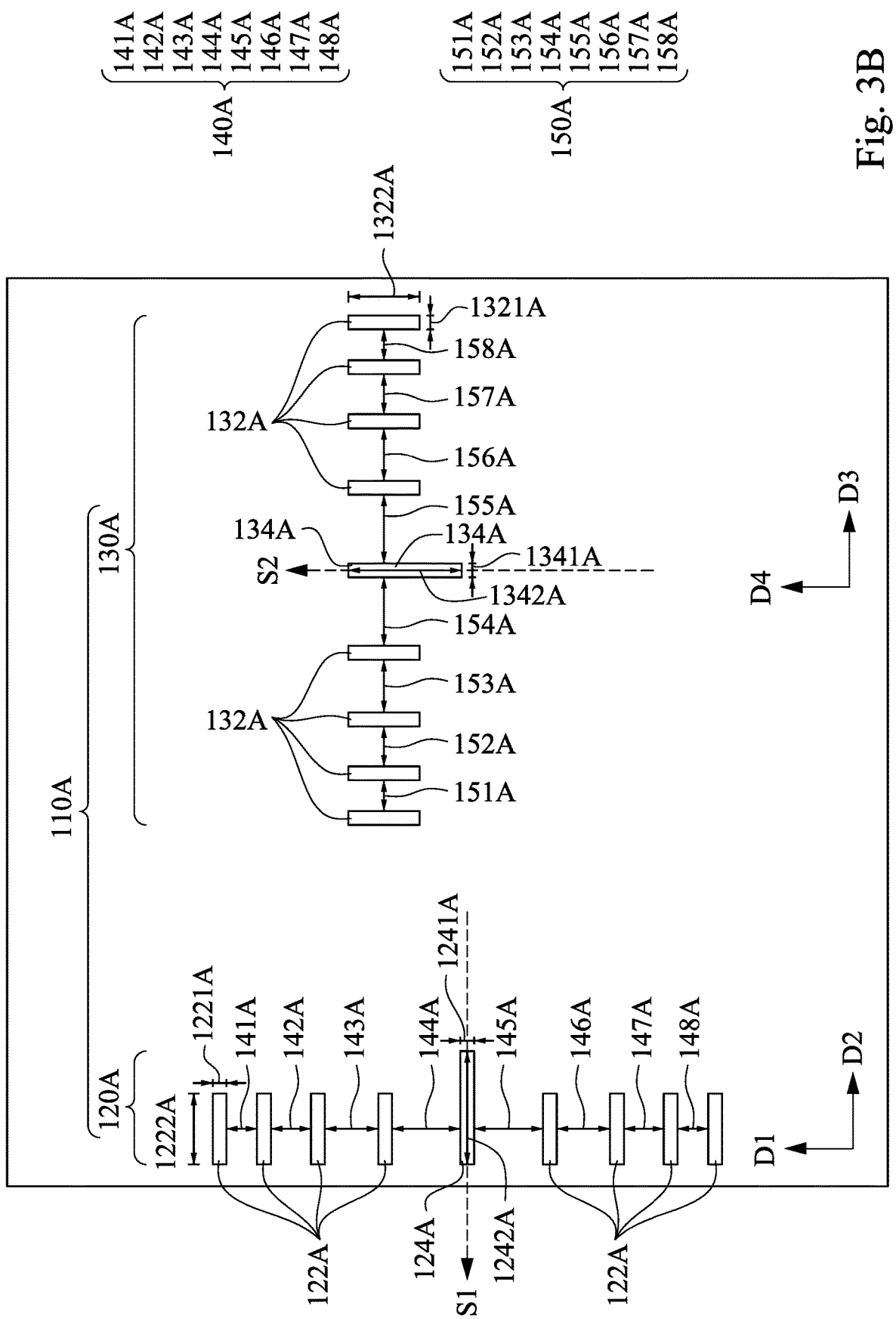
FIG. 3B is a top view of an overlay pattern of the overlay mark in FIG. 3A according to some embodiments of the present disclosure.

FIG. 3B is a top view of a first overlay pattern 110A of the overlay mark 110 in FIG. 3A according to some embodiments of the present disclosure. FIG. 3C is a top view of a second overlay pattern 110B of the overlay mark 110 in FIG. 3A according to some embodiments of the present disclosure. The first overlay pattern 110A includes a first pattern 120A and a second pattern 130A, and the second overlay pattern 110B includes a first pattern 120B and a second pattern 130B.

Referring to FIG. 3A and FIG. 3B, the first pattern 120A of the first overlay pattern 110A includes a plurality of first features 122A and a first center feature 124A that collectively distribute along a first direction D1. The first center feature 124A is located between two groups of the first features 122A. The numbers of the first features 122A of the two groups are the same. For example, each of the group includes four first features 122A, and is respectively located at opposite sides of the first center feature 124A. Although eight first features 122A are illustrated in FIG. 3A, fewer or more first features 122A can be included in the first pattern 120A. The first pattern 120A is symmetric with respect to a first symmetry axis S1. The first symmetry axis S1 is parallel to a second direction D2, and the second direction D2 is perpendicular to the first direction D1. That is, the first center feature 124A is itself symmetric with respect to the first symmetry axis S1.

The first features 122A each has a first dimension 1221A measured in the first direction D1 and a second dimension 1222A measured in the second direction D2. The first center feature 124A has a first dimension 1241A measured in the first direction D1 and a second dimension 1242A measured in the second direction D2. The first dimensions 1221A of the first features 122A and the first dimension 1241A of the first center feature 124A are substantially the same. The second dimensions 1222A of first features 122A are substantially the same. In some embodiments, the second dimension 1242A of the first center feature 124A is greater than the second dimensions 1222A of the first features 122A. In some embodiments, the second dimensions 1222A of the first features 122A are greater than the first dimensions 1221A of the first features 122A. The second dimension 1242A of the first center feature 124A is greater than the first dimension 1241A of the first center feature 124A. In other words, the first features 122A and the first center feature 124A are elongated along the second direction D2.

The first pattern 120A includes gaps 140A distributed along the first direction D1. In some embodiment, the gaps 140A includes gaps 141A, 142, 143A, 146A, 147A, and 148A located between each of two adjacent first features 122A, and gaps 144A, 145A located between the first center feature 124A and two adjacent first features 122A. At least two gaps 140A are the same but are different from the other gaps 140A. For example, in some embodiments, the gaps 141A equals to the gaps 148A, the gaps 142A equals to the gaps 147A, the gaps 143A equals to the gaps 146A, and the gaps 144A equals to the gaps 145A due to the symmetric property of the first pattern 120A. Two or three of the gaps 141A, 142A, 143A, and 144A may be equal, but the gaps 141A, 142A, 143A, and 144A are not all equal to each other and have no specific correlations. Similarly, two or three of the gaps 145A, 146A, 147A, and 148A may be equal, but the gaps 145A, 146A, 147A, and 148A are not all equal to each other and have no specific correlations. In other words, the gaps 140A are non-periodically distributed.

The second pattern 130A includes a plurality of second features 132A and a second center feature 134A that collectively distribute along a third direction D3. The second center feature 134A is located between two groups of the second features 132A. The numbers of the second features 132A of the two groups are the same. For example, each of the group includes four second features 132A, and is respectively located at opposite sides of the second center feature 134A. The second pattern 130A is symmetric with respect to a second symmetry axis S2. The second symmetry axis S2 is parallel to a fourth direction D4, and the fourth direction D4 is perpendicular to the third direction D3. That is, the second center feature 134A is itself symmetric with respect to the second symmetry axis S2. In some embodiments, the first direction D1 is perpendicular to the third direction D3. In some other embodiments, the first direction D1 is not perpendicular to the third direction D3.

The second features 132A respectively have a first dimension 1321A measured in the third direction D3 and a second dimension 1322A measured in the fourth direction D4. The second center feature 134A has a first dimension 1341A measured in the third direction D3 and a second dimension 1342A measured in the fourth direction D4. The first dimensions 1321A of first features 132A and the first dimension 1341A of the first center feature 134A are substantially the same. The second dimensions 1322A of second features 132A are substantially the same. In some embodiments, the second dimension 1342A of the second center feature 134A is greater than the second dimensions 1322A of the second features 132A. In some embodiments, the second dimensions 1322A of the second features 132A are greater than the first dimensions 1321A of the second features 132A. The second dimension 1342A of the second center feature 134A is greater than the first dimension 1341A of the second center feature 134A. In other words, the second features 132A and the second center feature 134A are elongated along the fourth direction D4.

The second pattern 130A includes gaps 150A distributed along the third direction D3. In some embodiment, the gaps 150A includes gaps 151A, 152A, 153A, 156A, 157A, and 158A located between each of two adjacent second features 132A, and gaps 154A, 155A located between the second center feature 134A and two adjacent second features 132A. At least two gaps 150A are the same but are different from the other gaps 150A. For example, in some embodiment, the gaps 151A equals to the gaps 158A, the gaps 152A equals to the gaps 157A, the gaps 153A equals to the gaps 156A, and the gaps 154A equals to the gaps 155A. Two or three of the gaps 151A, 152A, 153A, and 154A may be equal, but the gaps 151A, 152A, 153A, and 154A are not all equal to each other and have no specific correlations. Similarly, two or three of the gaps 155A, 156A, 157A, and 158A may be equal, but the gaps 155A, 156A, 157A, and 158A are not all equal to each other and have no specific correlations. In other words, the gaps 150A are non-periodically distributed.

Referring to FIG. 3A and FIG. 3C, the first pattern 120B of the second overlay pattern 110B includes a plurality of first features 122B and a first center feature 124B that collectively distribute along the first direction D1. The first center feature 124B is located between two groups of the first features 122B. The numbers of the first features 122B of the two groups are the same. For example, each of the group includes four first features 122B, and is respectively located at opposite sides of the first center feature 124B. The first pattern 120B is symmetric with respect to the first symmetry axis S1. The first symmetry axis S1 is parallel to the second direction D2, and the second direction D2 is perpendicular to the first direction D1. That is, the first center feature 124B is itself symmetric with respect to the first symmetry axis S1

The first features 122B respectively have a first dimension 1221B measured in the first direction D1 and a second dimension 1222B measured in the second direction D2. The first center feature 124B has a first dimension 1241B measured in the first direction D1 and a second dimension 1242B measured in the second direction D2. The first dimensions 1221B of the first features 122B and the first dimension 1241B of the first center feature 124B are substantially the same. The second dimensions 1222B of first features 122B are substantially the same. In some embodiments, the second dimension 1242B of the first center feature 124B is greater than the second dimensions 1222B of the first features 122B. In some embodiments, the second dimensions 1222B of the first features 122B are greater than the first dimensions 1221B of the first features 122B. The second dimension 1242B of the first center feature 124B is greater than the first dimension 1241B of the first center feature 124B. In other words, the first features 122B and the first center feature 124B are elongated along the second direction D2.

The first pattern 120B includes gaps 140B distributed along the first direction D1. In some embodiment, the gaps 140B includes gaps 141B, 142B, 143B, 146B, 147B, and 148B located between each of two adjacent first features 122B, and gaps 144B, 145B located between the first center feature 124B and two adjacent first features 122B. At least two gaps 140A are the same but are different from the other gaps 140A. For example, in some embodiments, the gaps 141A equals to the gaps 148A, the gaps 142A equals to the gaps 147A, the gaps 143A equals to the gaps 146A, and the gaps 144A equals to the gaps 145A due to the symmetric property of the first pattern 120A. Two or three of the gaps 141A, 142A, 143A, and 144A may be equal, but the gaps 141A, 142A, 143A, and 144A are not all equal to each other and have no specific correlations. Similarly, two or three of the gaps 145A, 146A, 147A, and 148A may be equal, but the gaps 145A, 146A, 147A, and 148A are not all equal to each other and have no specific correlations. In other words, the gaps 140A are non-periodically distributed. The distributions of the gaps 140B and gaps 140A are independent. In other words, in some embodiments, the distribution of gaps 140B and gaps 140A may be the same, while in some other embodiments, the distribution of gaps 140B and gaps 140A may be different.

The second pattern 130B includes a plurality of second features 132B and a second center feature 134B that collectively distribute along a third direction D3. The second center feature 134B is located between two groups of the second features 132B. The numbers of the second features 132B of the two groups are the same. For example, each of the group includes four second features 132B, and is respectively located at opposite sides of the second center feature 134B. The second pattern 130B is symmetric with respect to a second symmetry axis S2. The second symmetry axis S2 is parallel to a fourth direction D4, and the fourth direction D4 is perpendicular to the third direction D3. That is, the second center feature 134B is itself symmetric with respect to the second symmetry axis S2.

The second features 132B respectively have a first dimension 1321B measured in the third direction D3 and a second dimension 1322B measured in the fourth direction D4. The second center feature 134B has a first dimension 1341B measured in the third direction D3 and a second dimension 1342B measured in the fourth direction D4. The first dimensions 1321B of first features 132B and the first dimension 1341B of the first center feature 134B are substantially the same. The second dimensions 1322B of second features 132B are substantially the same. In some embodiments, the second dimension 1342B of the second center feature 134B is greater than the second dimensions 1322B of the second features 132B. In some embodiments, the second dimensions 1322B of the second features 132B are greater than the first dimensions 1321B of the second features 132B. The second dimension 1342B of the second center feature 134B is greater than the first dimension 1341B of the second center feature 134B. In other words, the second features 132B and the second center feature 134B are elongated along the fourth direction D4.

The second pattern 130B includes gaps 150B distributed along the third direction D3. In some embodiment, the gaps 150B includes gaps 151B, 152B, 153B, 156B, 157B, and 158B located between each of two adjacent second features 132B, and gaps 154B, 155B located between the second center feature 134B and two adjacent second features 132B. At least two gaps 150B are the same but are different from the other gaps 150B. For example, in some embodiment, the gaps 151B equals to the gaps 158B, the gaps 152B equals to the gaps 157B, the gaps 153B equals to the gaps 156B, and the gaps 154B equals to the gaps 155B. Two or three of the gaps 151B, 152B, 153B, and 154B may be equal, but the gaps 151B, 152B, 153B, and 154B are not all equal to each other and have no specific correlations. Similarly, two or three of the gaps 155B, 156B, 157B, and 158B may be equal, but the gaps 155B, 156B, 157B, and 158B are not all equal to each other and have no specific correlations. In other words, the gaps 150B are non-periodically distributed. The distributions of the gaps 150B and gaps 150A are independent. That is, in some embodiments, the distribution of gaps 150B and gaps 150A may be the same, while in some other embodiments, the distribution of gaps 150B and gaps 150A may be different.

Figure 4:
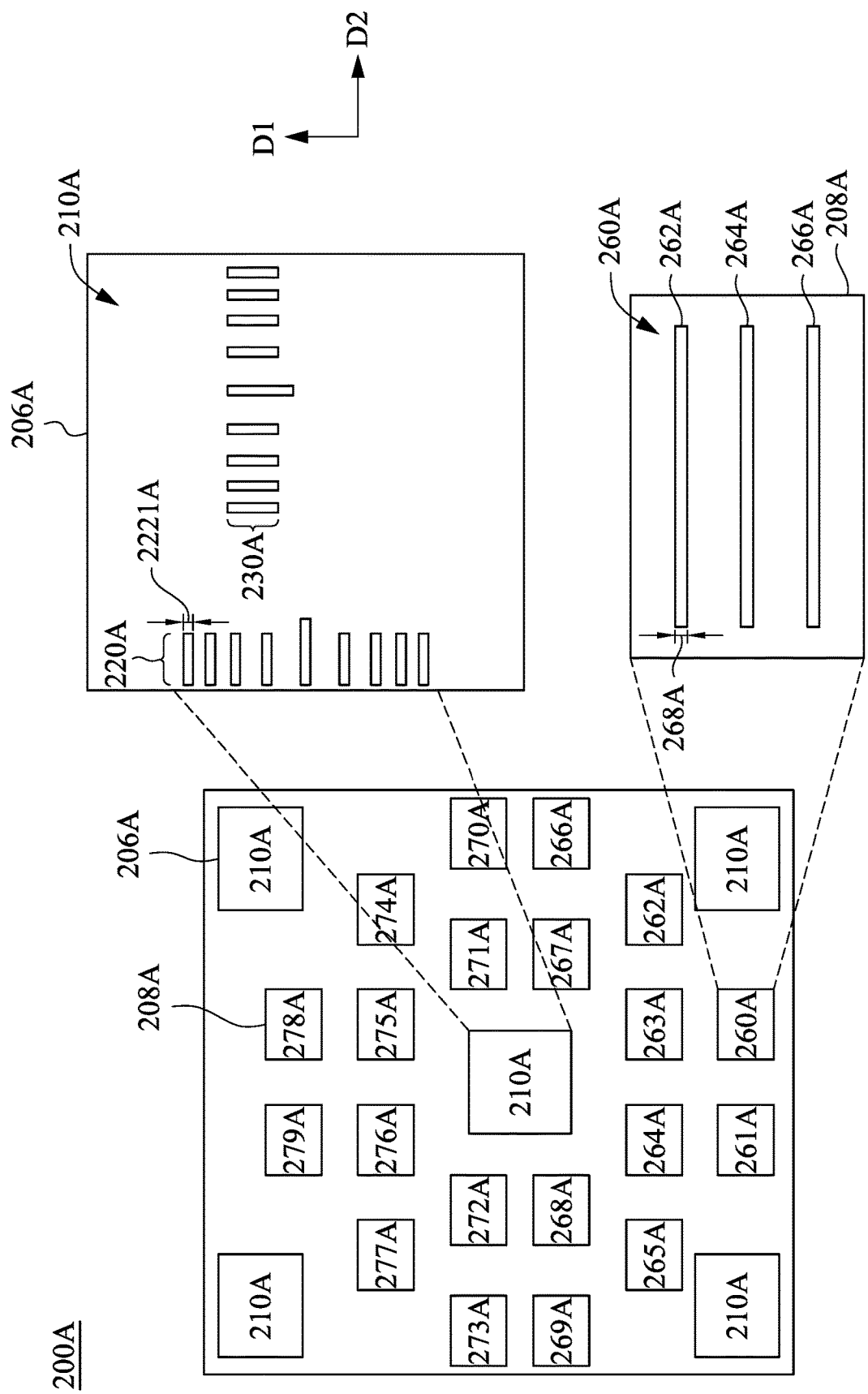
FIG. 4 is a top view of a photomask according to some embodiments of the present disclosure.

FIG. 4 is a top view of a photomask 200A according to some embodiments of the present disclosure. The photomask 200A is operable to project a plurality of patterns (or images) to a semiconductor wafer in a photolithography process. In some embodiments shown in FIG. 4, the photomask 200A includes overlay regions 206A and device regions 208A. The overlay regions 206A include an overlay pattern 210A, such as the first overlay pattern 110A in FIG. 3A. Thus, the overlay pattern 210A includes a first pattern 220A and a second pattern 230A. The device regions 208A also includes device patterns 260A-279A that each correspond to different portions of a semiconductor device, or different portions of different semiconductor devices. The semiconductor device(s) may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistor, bipolar junction transistors (BJT), laterally diffused MOS (LDMOS) transistors, high power MOS transistors, or other type of transistors.

For the sake of illustration and comparison, a top view of the device pattern 260A is shown in more detail. The device pattern 260A includes features 262A, 264A, and 266A that respectively denote portions of a semiconductor device. In some embodiments shown in FIG. 4, the features 262A, 264A, and 266A extend along the second direction D2. The features 262A, 264A, and 266A each includes a width 268A that is measured in the first direction D1. In some embodiments, the width 268A may referred to as a critical dimension, which represents the smallest feature size that can be formed on a substrate in a given semiconductor fabrication technology generation. In some embodiments, the dimensions of the patterns on the photomask 200A may be approximately 4 times the dimensions of the patterns on the wafer.

Figure 5:
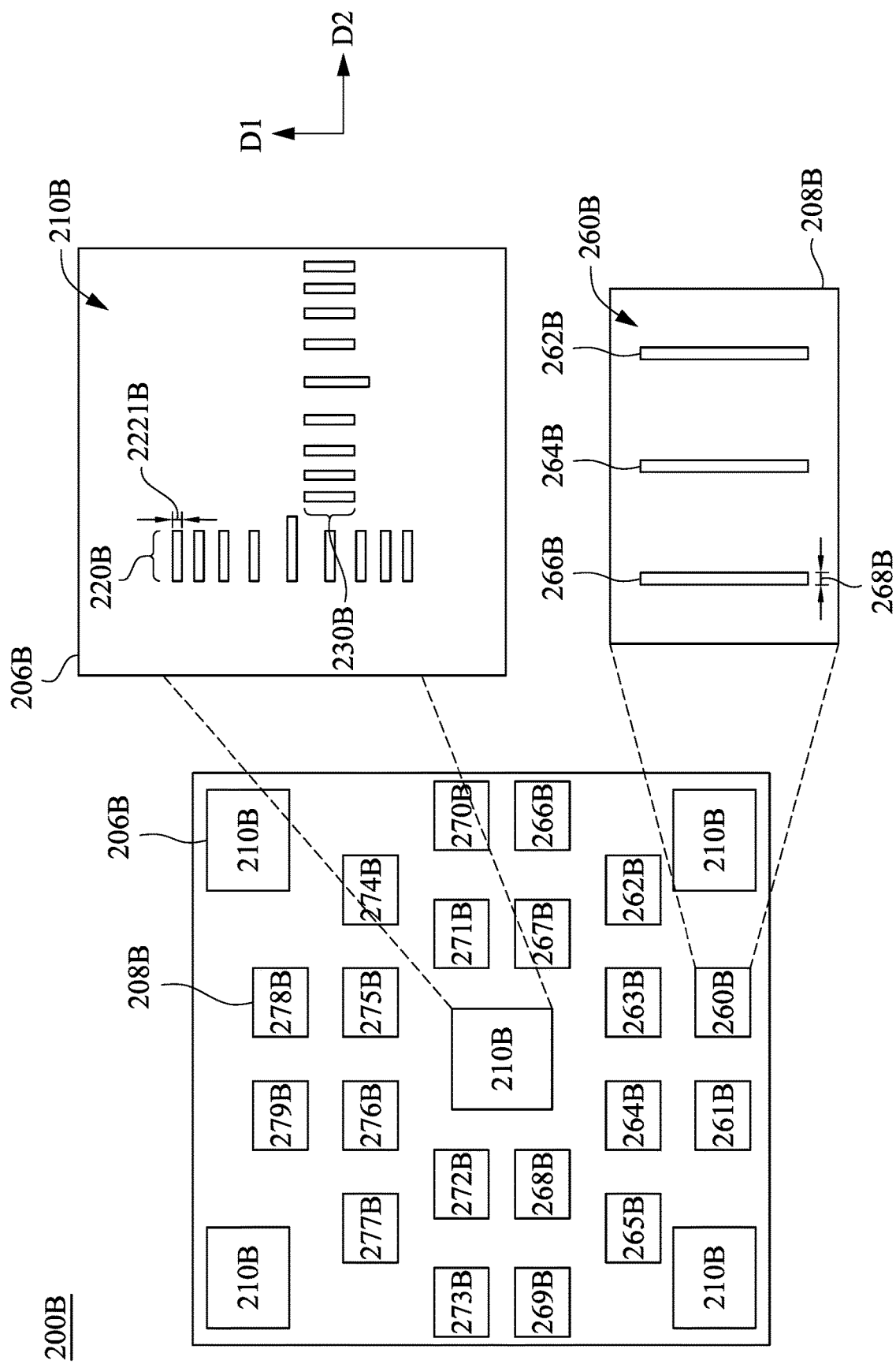
FIG. 5 is a top view of a photomask according to some embodiments of the present disclosure.

FIG. 5 is a top view of a photomask 200B according to some embodiments of the present disclosure. The photomask 200B is operable to project a plurality of patterns (or images) to a semiconductor wafer in a photolithography process. In some embodiments shown in FIG. 5, the photomask 200B includes overlay regions 206B and device regions 208B. The overlay regions 206B include an overlay pattern 210B, such as the second overlay pattern 110B in FIG. 3B. Thus, the overlay pattern 210B includes a first pattern 220B and a second pattern 230B. The photomask 200B also includes device patterns 260B-279B that each correspond to different portions of a semiconductor device, or different portions of different semiconductor devices. The semiconductor device(s) may include an IC chip, SoC, or portion thereof, and may include various passive and active microelectronic devices such as resistors, capacitors, inductors, diodes, MOSFET, CMOS transistor, BJT, LDMOS transistors, high power MOS transistors, or other type of transistors.

For the sake of illustration and comparison, a top view of the device pattern 260B is shown in more detail. The device pattern 260B includes features 262B, 264B, and 266B that respectively denote portions of a semiconductor device. The features 262B, 264B, and 266B extend along the first direction D1. The features 262B, 264B, and 266B each includes a width 268B that is measured in the first symmetric direction S1. Similar to the width 268A (FIG. 4), the width 268B also represents the critical dimension of a semiconductor fabrication technology generation as discussed above with reference to FIG. 4.

Figure 6:
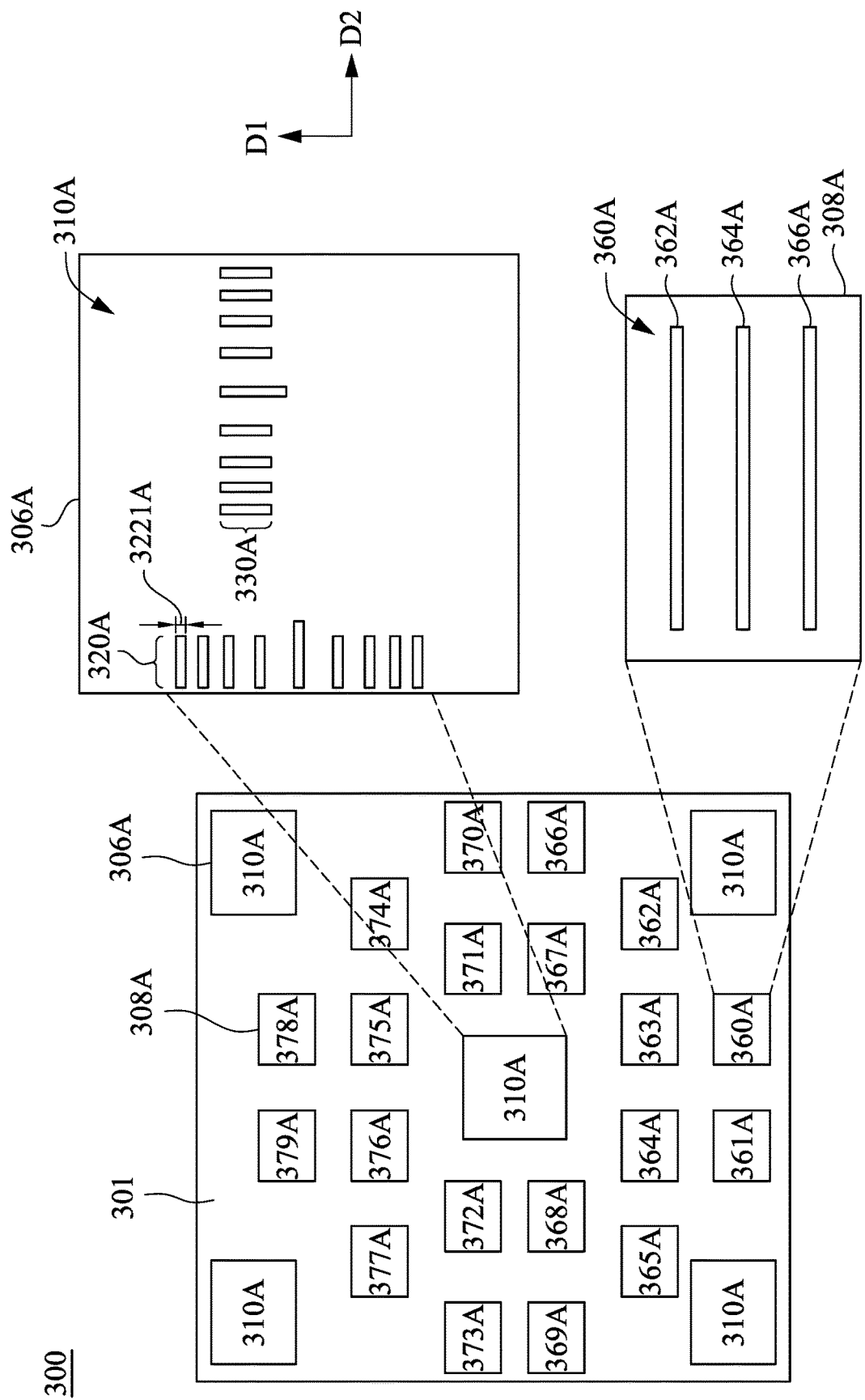
FIG. 6 is a top view of a portion of a wafer on which the patterns on the photomask in FIG. 4 is implemented according to some embodiments of the present disclosure.

FIG. 6 is a top view of a portion of a wafer 300 on which the patterns on the photomask 200A in FIG. 4 is implemented according to some embodiments of the present disclosure. The wafer 300 is semiconductor wafer. In some embodiments, the wafer 300 is doped with a P-type dopant such as boron. In some other embodiments, the wafer 300 is doped with an N-type dopant such as phosphorous or arsenic. The wafer 300 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the wafer 300 could include an epitaxial layer (epi layer), may be strained for performance enhancement, and may include a silicon-on insulator (SOI) structure.

The wafer 300 includes a layer 301. The photomask 200A (see FIG. 4) is used in a photolithography process to transfer the patterns 210A and 260A-279A on the photomask 200A to the layer 301 of the wafer 300 to form overlay patterns 310A and device patterns 360A-379A, respectively. The photolithography process may include depositing a photoresist layer on the layer 301; projecting the images of the overlay patterns 210A (see FIG. 4) and device patterns 260A-279A (see FIG. 4) onto the photoresist layer to form a patterned photoresist layer, using the patterned photoresist layer as a mask, patterning the layer 301 through an etching process, such as dry etching or wet etching; and removing the photoresist layer after the overlay patterns 210A and device patterns 260A-279A are transferred onto the layer 301 as overlay patterns 310A and device patterns 360A-379A, respectively. For the sake of illustration, the top views of the overlay patterns 310A and device pattern 360A are also shown in detail in FIG. 6. Since the overlay patterns 310A and device patterns 360A-379A are formed on the layer 301 at the end of the photolithography process, the layer 301 resembles the photomask 200A. It is understood that the physical dimensions of the patterns on the photomask 200A may not be equal to the physical dimensions of the corresponding patterns on the layer 301, though they may have a linear relationship. As an example, the first dimension 2221A (see FIG. 4) may not be equal to the first dimension 3221A, but may be directly proportional. In some embodiments, the dimensions of the overlay mark 310A and the device patterns 360B-379B in the layer 200A are approximately ½ of the dimensions of the overlay mark 210A and the respective device patterns 260A-279A of the photomask 200. The overlay pattern 310A and the device patterns 360B-379B formed in the layer 301 may be concave (trenches) or convex (islands).

Figure 7:
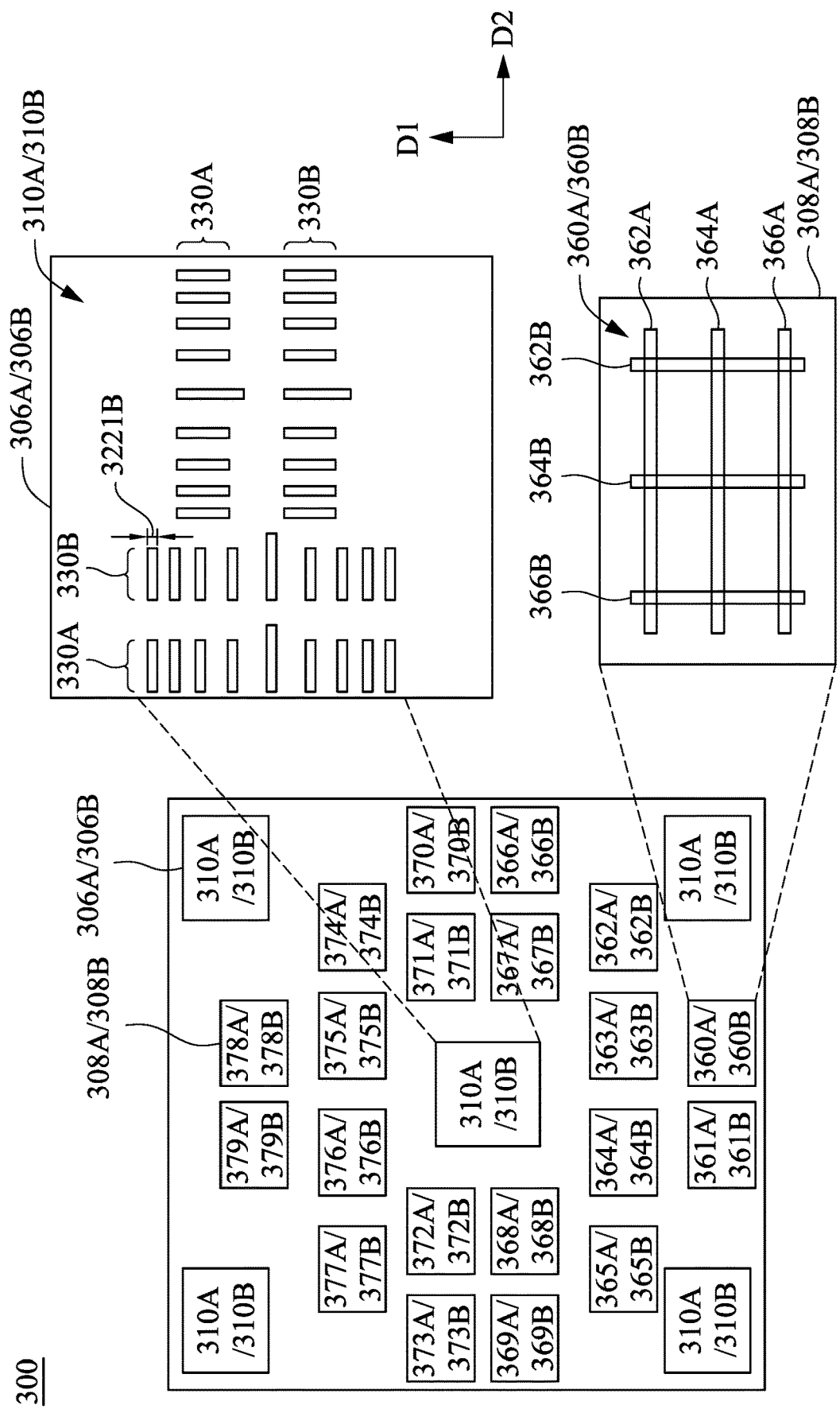
FIG. 7 is a top view of a portion of the wafer on which the patterns on the photomask in FIG. 4 and the photomask in FIG. 5 are implemented according to some embodiments of the present disclosure.

FIG. 7 is a top view of a portion of the wafer 300 on which the patterns on the photomask 200A in FIG. 4 and the photomask 200B in FIG. 5 are implemented according to some embodiments of the present disclosure. The photomask 200B (see FIG. 5) is used in a photolithography process that is similar to the photolithography process discussed above with reference to FIG. 6. Through these photolithography processes, the device patterns 210B (see FIG. 5) and 260B-279B (see FIG. 5) of the photomask 200B are transferred to the layer 301 of the wafer 300 to form device patterns 310B and 360B-379B, respectively. In some other embodiments, the wafer includes another layer disposed above the later 301, and the device patterns 210B and 260B-279B of the photomask 200B are transferred to the layer above the layer 301. In the embodiment shown in FIG. 7, the device patterns 260A-279A and the device patterns 260B-279B partially overlap, respectively (e.g., features 362A-366A overlap features 362B-366B). In other embodiments, the device patterns 260A-279A and the device patterns 260B-279B may not overlap. It is understood that the physical dimensions of the patterns on the photomask 200B may not be equal to the physical dimensions of the corresponding patterns on the layer 301, though they may have a linear relationship. As an example, the first dimension 2221B (FIG. 5) may not be equal to the first dimension 3221B (FIG. 7), but they be directly proportional. In an embodiment, the dimensions of the overlay pattern 310B and the device patterns 360B-379B in the layer 301 are approximately ¼ of the dimensions of the overlay pattern 210B and the respective device patterns 260B-279B of the photomask 200B. Moreover, the overlay mark 310B and the device patterns 360B-379B formed in the layer 301 may be concave (trenches) or convex (islands).

Figure 8:
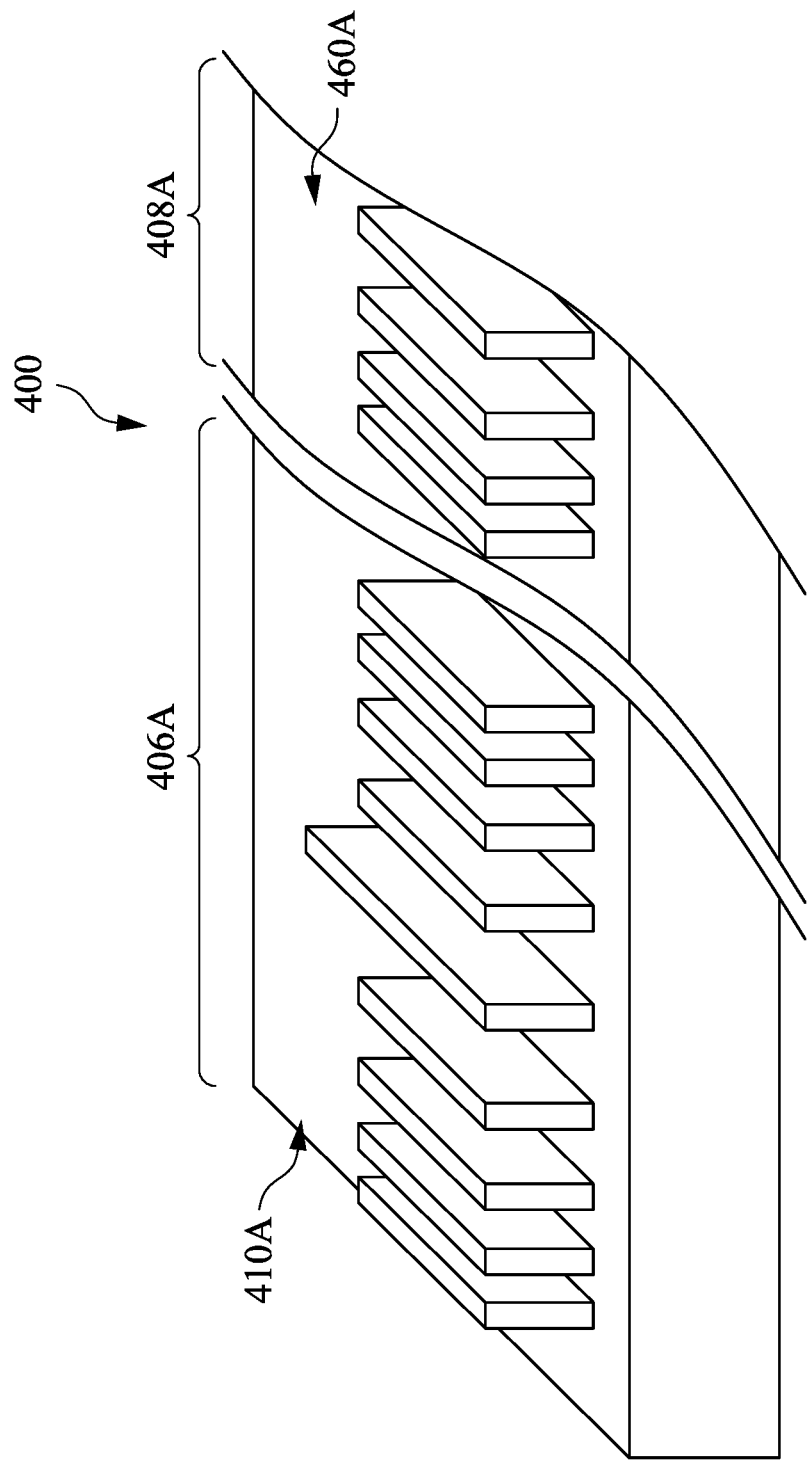
FIG. 8 is a perspective view of a portion of an overlay pattern on a substrate according to some embodiments of the present disclosure.

FIG. 8 is a perspective view of a portion of an overlay pattern 410A on a substrate 400 according to some embodiments of the present disclosure. FIG. 8 has been simplified for the sack of clarity by illustrating merely a portion of the overlay pattern 410A in an overlay region 406A and a portion of one of the device pattern 460A in a device region 408A. In some embodiments illustrated in FIG. 8, the overlay pattern 410A and the device pattern 460A may be convex structures such as fins or islands, as illustrated in FIG. 8. In some other embodiments, the overlay pattern 410A and the device pattern 460A may be concave structures such as trenches. The fabrication process of overlay pattern 410A and device pattern 460A in FIG. 8 will be described in detail later with reference made to FIGS. 9-11.

Figure 9:
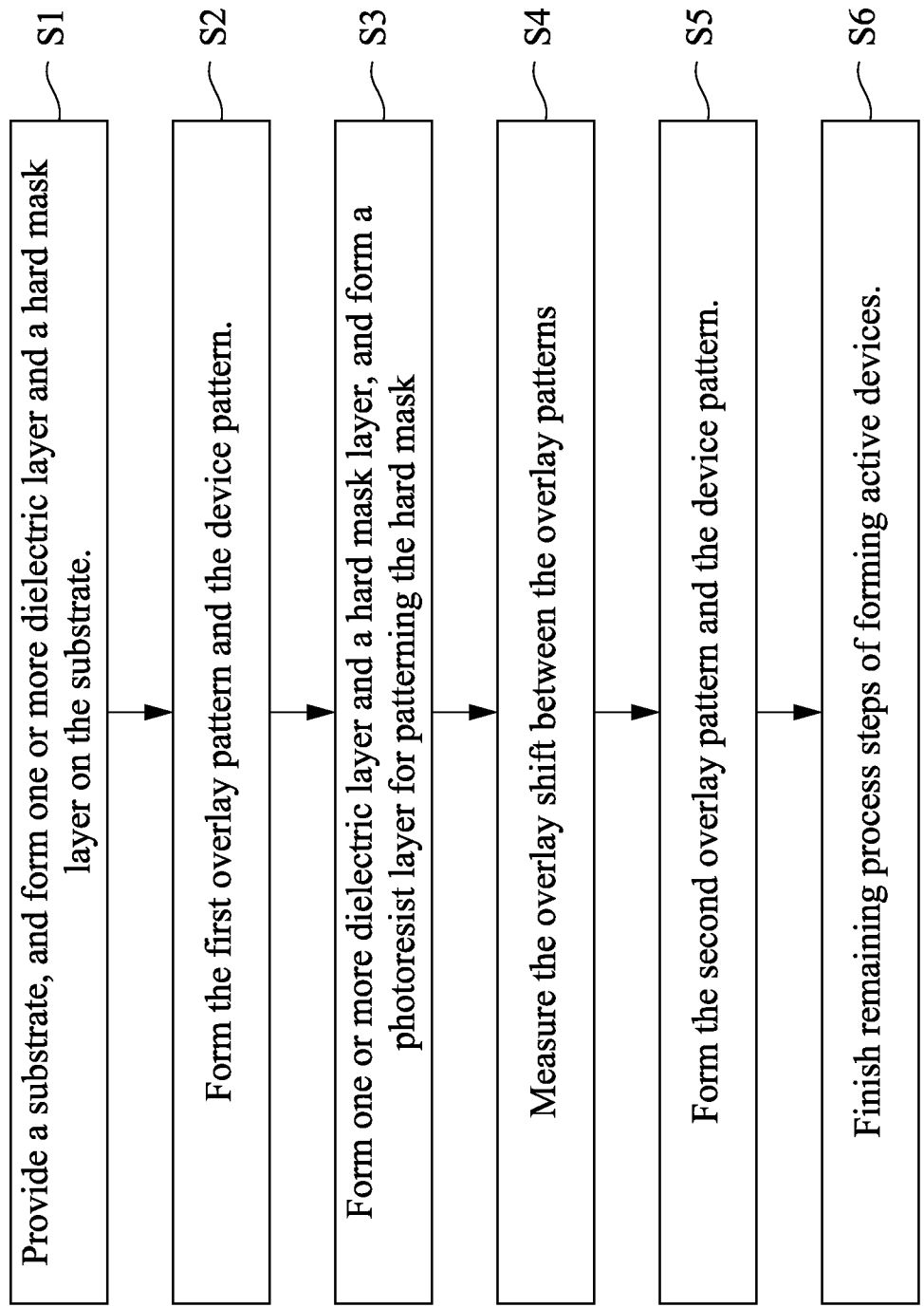
FIG. 9 is a flow chart of a method of forming the overlay mark including the overlay pattern and the device pattern illustrated in FIG. 8.
Figure 11:
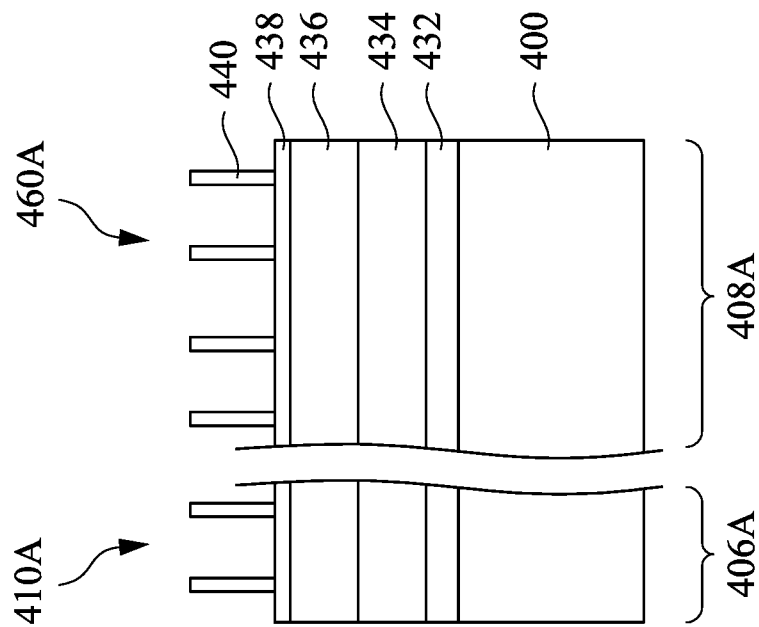
FIGS. 10-12 are the cross section views of the intermediate stages of the fabrication process of overlay pattern and the device pattern in FIG. 8.
Figure 10:
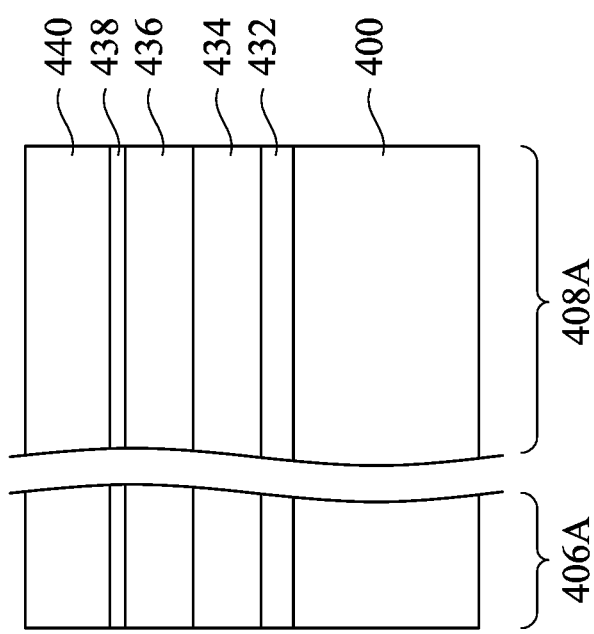
Figure 12:
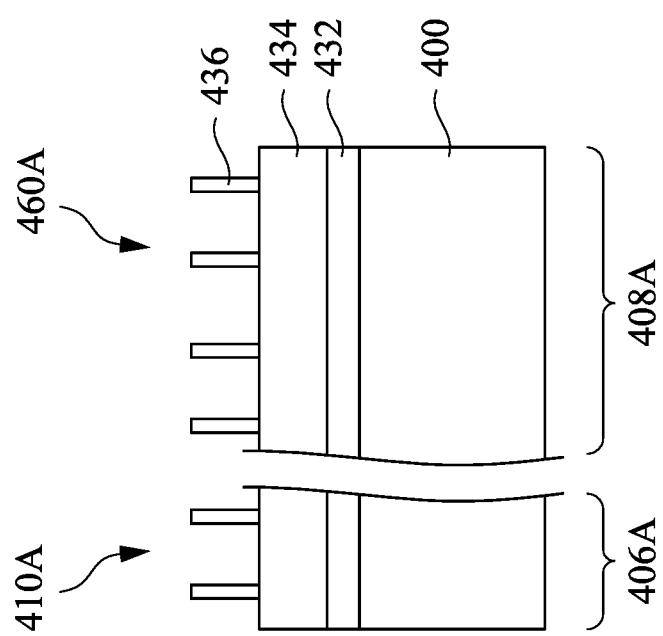
Figure 13:
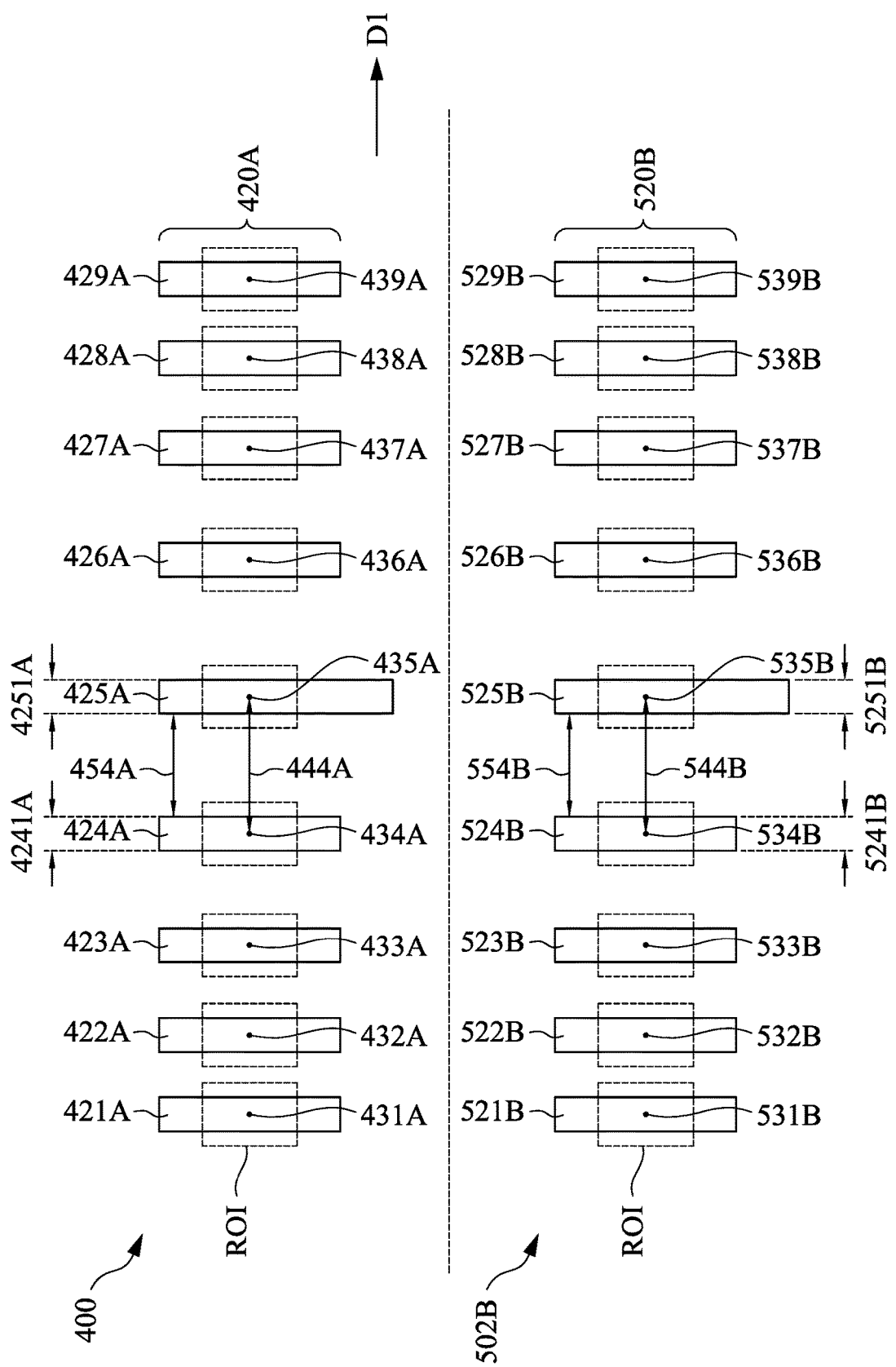
FIG. 13 is a top view of a portion of an overlay mark according to some embodiments of the present disclosure.

FIG. 9 is a flow chart of a method of forming the overlay mark 410 including the overlay pattern 410A and the device pattern 460A illustrated in FIG. 8. FIGS. 10-12 are the cross section views of the intermediate stages of the fabrication process of overlay pattern 410A and the device pattern 460A in FIG. 8. FIG. 13 is a top view of a portion of an overlay mark 410 according to some embodiments of the present disclosure. FIG. 14 is an intensity plot of images of the regions of interest (ROIs) in FIG. 13.

Referring to FIG. 10, in step S1, a substrate 400 is provided. The substrate 400 includes an overlay region 406A for forming an overlay mark and includes a device region 408A for forming an active device. In some embodiments as describe in FIG. 1, the overlay region 406A is contained within scribe lines around the device region 408A. The substrate 400 may include various doped regions depending on design requirements as known in the art (e.g., p-type wells or n-type wells).

Referring still to FIG. 10, one or more dielectric layers may be formed on the substrate 400. In some embodiments, the dielectric layers include an inter-facial layer 432, a first intermediate dielectric layer 434, a second intermediate dielectric layer 436, and a capping layer 438. Materials for the dielectric layers may be selected based on a number of criteria. For example, the materials may be selected based on an associated etchant. Particularly in, but not limited to, embodiments where a dielectric layer is etched without etching adjacent layers, such as when an adjacent layer is used as a mask to guide the etching, materials are selected accordingly. Buffered hydrofluoric acid etches silicon oxide at a considerably higher rate than silicon nitride. Alternately, phosphoric acid selectively etches silicon nitride at a higher rate than silicon oxide. For the purposes of this disclosure, etching includes ashing processes. Ashing removable dielectrics (ARDs) are more sensitive to ashing processes (e.g. Oashing, Nashing, or Hashing) than other potential dielectrics. Thus, a dielectric layer may include an ARD.

Materials for the dielectric layers may be selected based on any other suitable design criteria, examples of which include the materials structural characteristics and/or etching profile. In an exemplary embodiment, the interfacial layer 432 includes silicon oxide, the first intermediate dielectric layer 434 includes silicon nitride, the second intermediate dielectric layer 436 includes an ARD, and the capping layer 438 includes silicon nitride.

The dielectric layers including the interfacial layer 432, the first intermediate dielectric layer 434, the second intermediate dielectric layer 436, and the capping layer 438 are formed by any suitable technique including spin-on, physical vapor deposition (PVD), chemical vapor deposition (CVD), high density plasma CVD (HDP-CVD), and atomic layer deposition (ALD) and may be formed to any suitable depth.

Referring still to FIG. 10, a hard mask layer 440 is formed on the substrate 400. The hard mask layer 440 is formed of any suitable material, examples of which include silicon nitride, SiON. SiC. SiOC, spin-on glass (SOG), a low-k film, tetraethylorthosilicate (TEOS), plasma enhanced CVD oxide (PE-oxide), high-aspect-ratio-process (HARP) formed oxide, other suitable material, and/or combination thereof. In an embodiment, the hard mask layer 440 is a multiple layer film.

Referring to FIG. 11A, in step S2, the hard mask layer 440 is patterned to produce overlay pattern 410A within the overlay region 406A and device pattern 460A within the device region 408A. In an embodiment, a photomask as an embodiment in FIG. 4 is used to pattern the hard mask layer 440 in a photolithographic patterning process. The photolithographic processes may include photoresist coating (e.g., spin-on coating), soft baking, mask aligning, exposure, post-exposure baking, developing the photoresist, rinsing, drying (e.g., hardbaking), and etching the hard mask layer 440 using the exposed and developed photoresist. Suitable etching processes include dry etching, wet etching, and/or other etching methods (e.g., reactive ion etching). Alternatively, the photolithographic process may be implemented, supplemented, or replaced by other methods such as maskless photolithography, electron-beam writing, and ion-beam writing.

Alternatively, referring to FIG. 12, in some embodiments, an etch may performed to transfer the overlay pattern 410A and the device pattern 460A to one of the dielectric layers above the substrate. For example, as illustrated in FIG. 12, the overlay pattern 410A and the device pattern 460A are formed on the second intermediate dielectric layer 436. In some embodiments, the overlay pattern 410A and the device pattern 460A are formed in one of the layers above the substrate 400, and the dielectric layers above the layer where the overlay pattern 410A and the device pattern 460A are formed are removed later.

In step S3, one or more dielectric layers and hard mask layer are formed on the substrate 400 or the dielectric layer where the overlay pattern 420A and the device pattern 460A are formed (e.g., the second intermediate dielectric layer 436 in FIG. 12), and a photomask 500B as an embodiment in FIG. 5 is used to pattern the hard mask layer. In some embodiments, a photoresist layer is formed above the hard mask layer, and the photomask 500B is exposed to form the overlay pattern 520B on the photoresist layer. Thus, the overlay shift would be determined by the difference between a center of the overlay pattern 420A and a center of the overlay pattern 520B.

Referring to FIG. 13, in step S4, the overlay shift between the overlay pattern 420A on the substrate 400 and the overlay pattern 520B on a photoresist layer 502B patterned by the photomask 500B is measured. For the sake of clarity, only a first pattern 420A and a first pattern 520B are illustrated. For example, in some embodiment, the locations of the overlay pattern 420A and the overlay pattern 520B are irradiated by a radiation source of an overlay metrology tool, a reflectivity is detected by a measurement system of the overlay metrology tool, and a reflectivity profile may be determined by a calculating unit of the overlay metrology tool. Thus, the center of the overlay pattern 420A and the center of the overlay pattern 520B would be determined, as described in detail below.

The first pattern 420A includes first features 421A-429A distributed along a first direction D1. The first pattern 520B includes overlay features 521B-529B distributed along the first direction D1. The first features 421A-429A respectively has centroids 431A-439A, and the first features 521B-529B respectively has centroids 531B-539B. Specifically, in some embodiments, the images within the regions of interest (ROIs) of each of the first features 421A-429A and each of the first features 521B-529B are acquired (e.g., by the measurement system described above) and processed (e.g., by the calculating unit described above) by the overlay metrology tool to determine the centroids 431A-439A and 531B-539B. In other words, in the embodiments illustrated in FIG. 13, the centroids 431A-439A and the centroids 531B-539B are the coordinates of the intensity peaks representing the locations of each of the first features 421A-429A and each of the first features 521B-539B along the first direction D1.

FIG. 14 is an intensity plot of images of the regions of interest (ROIs) in FIG. 13. Each two adjacent centroids (or the image peaks) of 431A-439A and 531B-539B form the intervals 441A-448A and 541B-548B along the first axis X. The information of both the first features 421A-429A and the first features 521B-529B may then be analyzed by the analyzer (e.g., the calculating unit described above) to derive the overlay shift.

It is understood that, as described in FIG. 3A-3C, each of the intervals 441A-448A is defined as the sum of the corresponding gap and the first dimensions of the first features measured along the first direction D1. For example, as illustrated in FIG. 13, the interval 444A is defined as the sum of the gap 454A and one-half of the first dimension 4241A of first feature 424A and one-half of the first dimension 4251A of the first feature 425A. Each of the intervals 541B-548B is defined as the sum of the corresponding gap and the first dimensions of the first features. For example, as illustrated in FIG. 13, the interval 544B is defined as the sum of the gap 554B and one-half of the first dimension 5241B of the first feature 524B and one-half of the first dimension 5251B of the first feature 525B. Thus, as described above, the intervals 441A-448A and 541B-548B have symmetric property and are non-periodically distributed. In other words, the intervals 441A equals to 448A, the interval 442A equals to 447A, the intervals 443A equals to 446A, and the intervals 444A equals to 445A; the intervals 541B equals to 548B, the interval 542B equals to 547B, the intervals 543B equals to 546B, and the intervals 544B equals to 545B.

In some embodiments, the intervals 441A-448A may gradually decrease from the center to the opposite sides of the first pattern 420A, for example, the intervals 444A>443A>442A>441A, and the intervals 445A>446A>447A>448A. In some other embodiments, the intervals 441A-448A may gradually increase from the center to the opposite sides of the first pattern 420A, for example, the intervals 441A>442A>443A>444A, and the intervals 445A<446A<447A<448A. In some other embodiments, the intervals 441A-448A may change irregularly. Thus, in the embodiment shown in FIG. 13 and FIG. 14, based on coordinates of the centroids 441A-448A on the first axis X and the symmetric property of the intervals 441A-448A, the locations of the center CA of the first pattern 420A in can be determined. Theoretically, in the embodiments shown in FIG. 13 and FIG. 14, the center CA of the first pattern 420A is the centroid 435A.

Similarly, as shown in FIG. 13 and FIG. 14, the intervals 541B-548B may gradually decrease from the center to the opposite sides of the first pattern 520B, for example, the intervals 544B>543B>542B>541B, and the intervals 545B>546B>547B>548B. In some other embodiments, the intervals 441B-448B may gradually increase from the center to the opposite sides of the first pattern 520B, for example, the intervals 541B>542B>543B>544B, and the intervals 545B<546B<547B<548B. In some other embodiments, the intervals 541B-548B may change irregularly. Thus, in the embodiment shown in FIG. 13 and FIG. 14, based on coordinates of the centroids 441B-448B on the first axis X and the symmetric property of the intervals 441B-448B, the locations of the center CB of the first pattern 520B in can be determined. Theoretically, in the embodiments shown in FIG. 13 and FIG. 14, the center CB of the first pattern 520B is the centroid 535B.

The non-periodic distribution property of the intervals 441A-448A would avoid the overlay metrology tool to capture the centroid of the nearby feature as the center of the first pattern 420A. And the non-periodic distribution property of the intervals 441B-448B would avoid the overlay metrology tool to capture the centroid of the nearby feature as the center of the first pattern 520B. For example, if the image of one of the first feature of the first pattern 420A is missing or incomplete, the distribution of centroids of the rest of the first features may help to recover the complete distribution of centroids, thus increase the accuracy of the overlay measurement.

The intervals 541A-548A are independent from the intervals 541B-548B. For example, in some embodiments, when the intervals 441A-448A gradually decrease from the center to the opposite sides of the first pattern 420A, the intervals 541B-548B may gradually decrease, or gradually increase, or irregularly change from the center to the opposite sides of the first pattern 520B. In some embodiments, when the intervals 441A-448A gradually increase from the center to the opposite sides of the first pattern 420A, the intervals 541B-548B may gradually decrease, or gradually increase, or irregularly change from the center to the opposite sides of the first pattern 520B. In some embodiments, when the intervals 441A-448A irregularly change from the center to the opposite sides of the first pattern 420A, the intervals 541B-548B may gradually decrease, or gradually increase, or irregularly change from the center to the opposite sides of the first pattern 520B. In other words, the ways the intervals 541A-544A changed has no specific relationship with the ways the intervals 541B-548B changed, and the values of the intervals 541A, 542A, 543A, and 544A may not respectively equal to the intervals 541B, 542B, 543B, and 544B.

Thus, in the embodiment shown in FIG. 14, the overlay shift L1 along the first direction D1 between the wafer 400 and the photomask 500 can be determined from the difference between the center CA of the first pattern 420A and the center CB of the first pattern 520B. The overlay shift L2 (not shown) along the second direction D2 can be determined by the same manner. Thus, the overlay shift between the wafer 400 and the photomask 500 can be corrected. In some embodiments, the overlay shift is evaluated to determine whether the overlay shift is acceptable to continue the process. If the overlay shift is greater than an acceptable value, the photoresist would be removed and the position of the photomask 500 would be adjusted to perform the photoresist exposure process again.

In step S5, after the overlay shift between the overlay pattern 420A and the overlay pattern 520B are reduced to an acceptable value, the overlay pattern 520B and the device pattern 560B on the photomask 500B are transferred onto the substrate 400 or another layer above the substrate 400 to form the overlay pattern 420B and the device pattern 460B.

In step S6, remaining process steps for forming active devices are performed. In various embodiments, these include epitaxial growth processes to form elevated source/drain structures, implantation processes, depositions such as shallow trench isolation feature deposition, annealing processes, and chemical-mechanical planarization (CMP) processes.

FIG. 15 is an overlay mark 610 according to other embodiments of the present disclosure. The overlay mark 610 includes a first pattern 620A and 620B distributed along a first direction D1, and a second pattern 630A and 630B distributed along a second direction D2. As illustrated, the first direction D1 is not perpendicular to the second direction D2. The overlay shift L1 along the first direction D1 and the overlay shift L2 along the second direction D2 may be respectively split to two components along the coordinate used in the overlay metrology tool.

The symmetric and the non-periodic distribution properties of the overlay patterns can improve the overlay accuracy. For example, the overlay shift can be improved with about 1~2 nm, and the overlay accuracy can increase for the dies located at wafer edge. In addition, in some embodiment, the overlay features includes the center features having greater second dimension may also help the users to perform manual operation if it is needed. As a result, the overlay mark of the present disclosure can improve the overlay accuracy and increase the yield of dies located at wafer edge.

According to some embodiments of the present disclosure, an apparatus includes an overlay mark. The overlay mark includes a first portion including a first pattern and a second portion including a second pattern. The first pattern includes a plurality of first features and a first center feature each separated by a gap along a first direction. At least two gaps are the same but are different from the other gaps, and the first features are symmetric with respect to the first center feature. The second pattern includes a plurality of second features and a second center feature each separated by a gap along the first direction. At least two gaps are the same but are different from the other gaps, and the second features are symmetric with respect to the second center feature. The first center feature of the first pattern is aligned with the second center feature of the second pattern along a second direction.

According to some embodiments of the present disclosure, an apparatus includes an overlay mark. The overlay mark includes a first portion including a first pattern and a second pattern. The first pattern includes a plurality of first features each separated by a first gap along a first direction. At least two gaps are the same but are different from the other gaps, and the first pattern is symmetric with respect to a first symmetric axis. The second pattern includes a plurality of second features each separated by a second gap along a second direction. At least two gaps are the same but are different from the other gaps, and the second pattern is symmetric with respect to a second symmetric axis. The first symmetric axis is parallel to a third direction perpendicular to the first direction, and the second symmetric axis is parallel to a fourth direction perpendicular to the second direction.

According to some embodiments of the present disclosure, a method includes forming a first portion of an overlay mark including a first pattern on a substrate, the first pattern includes a plurality of first features distributed along a first direction; providing a second portion of the overlay mark, the second pattern includes a plurality of second features distributed along the first direction; determining a center of the first pattern of the first portion according to the distribution of intervals between adjacent first features along the first direction and determining a center of the second pattern of the second portion according to the distribution of intervals between adjacent second features along the first direction; and forming the second portion of the overlay mark on the substrate, the center of the first pattern of the first portion is aligned with the center of the second pattern of the second portion along the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising an overlay mark, wherein the overlay mark comprising:
    a first portion, comprising:
        a first pattern comprising a plurality of first features and a first center feature each separated by a gap along a first direction, wherein at least two gaps are the same but are different from the other gaps, and the first features are symmetric with respect to the first center feature; and
    a second portion, comprising:
        a second pattern comprising a plurality of second features and a second center feature each separated by a gap along the first direction, wherein at least two gaps are the same but are different from the other gaps, and the second features are symmetric with respect to the second center feature;
        wherein the first center feature of the first pattern is aligned with the second center feature of the second pattern along a second direction.

2. The apparatus of claim 1, wherein the second direction is perpendicular to the first direction.

3. The apparatus of claim 1, further comprising a first photomask and a second photomask, wherein the first portion of the overlay mark is located on the first photomask, and the second portion of the overlay mark is located on the second photomask.

4. The apparatus of claim 1, further comprising a semiconductive device comprising one or more layers, wherein the first portion and the second portion are disposed within one of the layers of the semiconductor device.

5. The apparatus of claim 1, further comprising a semiconductive device comprising one or more layers, wherein the first portion and the second portion are respectively disposed within two different layers of the semiconductor device.

6. The apparatus of claim 1, wherein the first portion of the overlay mark further comprises:
    a third pattern comprising a plurality of third features and a third center feature each separated by a gap along a third direction, wherein at least two gaps are the same but are different from the other gaps, and the third features are symmetric with respect to the third center feature; and
the second portion of the overlay mark further comprises:
    a fourth pattern comprising a plurality of fourth features and a fourth center feature each separated by a gap along the third direction, wherein at least two gaps are the same but are different from the other gaps, and the fourth pattern is symmetric with respect to the fourth center feature;

wherein the third center feature of the third pattern is aligned with the fourth center feature of the fourth pattern along a fourth direction perpendicular to the third direction.

7. The apparatus of claim 1, wherein the gaps of the first pattern and the second pattern are respectively composed by a plurality of pairs of the gaps containing the same gap sizes, and the sizes of the gaps of each pair are different.

8. An apparatus comprising an overlay mark, wherein the overlay mark comprising:
   a first portion, comprising:
      a first pattern comprising a plurality of first features each separated by a first gap along a first direction, wherein at least two gaps are the same but are different from the other gaps, and the first pattern is symmetric with respect to a first symmetric axis; and
      a second pattern comprising a plurality of second features each separated by a second gap along a second direction; wherein at least two gaps are the same but are different from the other gaps, and the second pattern is symmetric with respect to a second symmetric axis;
   wherein the first symmetric axis is parallel to a third direction perpendicular to the first direction, and the second symmetric axis is parallel to a fourth direction perpendicular to the second direction.

9. The apparatus of claim 8, wherein first dimensions of each of the first features measured in the first direction are substantially the same, and second dimensions of each of the second features measured in the second direction are substantially the same.

10. The apparatus of claim 8, wherein one of the first feature has a third dimension measured in a third direction perpendicular to the first direction greater than the third dimensions of the other first features, and one of the second feature has a fourth dimension measured in a fourth direction perpendicular to the second direction greater than the fourth dimensions of the other second features.

11. The apparatus of claim 8, wherein the first gaps are composed by a first pair includes a first gap size located at the same distance away from the first symmetric axis, a second pair includes a second gap size located at the same distance away from the first symmetric axis, and the first gap size is different from the second gap size, the second gaps are composed by a third pair includes a third gap size located at the same distance away from the second symmetric axis, a fourth pair includes a fourth gap size located at the same distance away from the second symmetric axis, and the third gap size is different from the fourth gap size.

12. The apparatus of claim 8, wherein the first gaps are composed by a plurality of pairs of the first gaps, the pairs of the first gaps are distributed from a center of the first feature to two opposite ends of the first feature, the sizes of the first gaps of each pair are gradually increased from the center to the two opposite ends.

13. The apparatus of claim 8, wherein the first gaps are composed by a plurality of pairs of the first gaps, the pairs of the first gaps are distributed from a center of the first feature to two opposite ends of the first feature, the sizes of the first gaps of each pair are gradually decreased from the center to the two opposite ends.

14. The apparatus of claim 8, wherein the overlay mark further comprises:
   a second portion, comprising:
      a third pattern comprising a plurality of third features each separated by a gap along the first direction, wherein at least two gaps are the same but are different from the other gaps, and the third pattern is symmetric with respect to the first symmetric axis; and
      a fourth pattern including a plurality of fourth features each separated by the gaps along the second direction, wherein at least two gaps are the same but are different from the other gaps, and the fourth pattern is symmetric with respect to the second symmetric axis.

15. The apparatus of claim 14, further comprising a first photomask and a second photomask, wherein the first portion of the overlay mark is located on the first photomask, and the second portion of the overlay mark is located on the second photomask.

16. A method, comprising:
   forming a first portion of an overlay mark comprising a first pattern on a substrate, wherein the first pattern comprises a plurality of first features distributed along a first direction;
   providing a second portion of the overlay mark comprising a second pattern on a photomask, wherein the second pattern comprises a plurality of second features distributed along the first direction;
   determining a center of the first pattern of the first portion according to the distribution of intervals between adjacent first features along the first direction and determining a center of the second pattern of the second portion according to the distribution of intervals between adjacent second features along the first direction; and
   forming the second portion of the overlay mark on the substrate, wherein the center of the first pattern of the first portion is aligned with the center of the second pattern of the second portion along the first direction, wherein the distribution of the intervals of adjacent first features is determined by differences between peaks of images of portions of each of the first features, and the distribution of the intervals of adjacent second features is determined by differences between peaks of images of portions of each of the second features.

17. The method of claim 16, wherein the providing a second portion of the overlay mark further comprises exposing the second portion of the overlay mark on a photoresist layer.

18. The method of claim 16, further comprising determining an overlay shift between the first pattern of the first portion of the overlay mark and the second pattern of the second portion of the overlay mark.

19. The method of claim 16, further comprising adjusting the position of the photomask relative to the substrate based on the center of the first pattern of the first portion and the center of the second pattern of the second portion.

20. The method of claim 16, wherein forming the first portion of the overlay mark is such that the first pattern is symmetric with respect to the center thereof.

* * * * *